United States Patent
Blackshear et al.

(10) Patent No.: US 9,048,245 B2
(45) Date of Patent: Jun. 2, 2015

(54) METHOD FOR SHAPING A LAMINATE SUBSTRATE

(75) Inventors: Edmund Blackshear, Wappingers Falls, NY (US); Thomas E. Lombardi, Poughkeepsie, NY (US); Donald A. Merte, Poughkeepsie, NY (US); Steven P. Ostrander, Poughkeepsie, NY (US); Thomas Weiss, Poughkeepsie, NY (US); Jiantao Zheng, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 13/488,678

(22) Filed: Jun. 5, 2012

(65) Prior Publication Data

US 2013/0320069 A1  Dec. 5, 2013

(51) Int. Cl.
| | |
|---|---|
| *B23K 31/00* | (2006.01) |
| *B23K 31/02* | (2006.01) |
| *B23K 1/00* | (2006.01) |
| *B23K 1/008* | (2006.01) |
| *B23K 1/19* | (2006.01) |
| *B23K 37/00* | (2006.01) |
| *B23K 37/04* | (2006.01) |
| *H01L 23/00* | (2006.01) |
| *H01L 21/673* | (2006.01) |

(52) U.S. Cl.
CPC ......... *H01L 23/562* (2013.01); *H01L 21/67333* (2013.01)

(58) Field of Classification Search
USPC ............. 228/122.1, 123.1, 124.1, 124.5, 178, 228/179.1
See application file for complete search history.

(56) References Cited

U.S. PATENT DOCUMENTS

| | | | |
|---|---|---|---|
| 5,461,774 | A | 10/1995 | Holmes et al. |
| 5,665,631 | A | 9/1997 | Lee et al. |
| 6,292,369 | B1 | 9/2001 | Daves et al. |
| 6,770,961 | B2 | 8/2004 | Lee |
| 6,900,073 | B2 | 5/2005 | Bezama et al. |

(Continued)

FOREIGN PATENT DOCUMENTS

| | | |
|---|---|---|
| JP | 01-170089 | 7/1989 |
| JP | 01-272189 | 10/1989 |

(Continued)

OTHER PUBLICATIONS www.dictionary.com "correction".*

(Continued)

*Primary Examiner* — Erin Saad
(74) *Attorney, Agent, or Firm* — Steven Meyers; L. Jeffrey Kelly

(57) ABSTRACT

A method including providing a fixture comprising a trap ring, a base plate having a recess adapted to receive a laminate substrate, the base plate including an opening and an adjustable height center button disposed in the opening, the opening being located within the recess and located in a center of the laminate substrate, characterizing the laminate substrate for warpage characteristics by using one of room temperature techniques and elevated temperature techniques, determining a horizontal plane distortion based on the warpage characteristics, and placing the laminate substrate into the fixture with an adjustment to correct the horizontal plane distortion, the adjustment is provided by the adjustable height center button, wherein the adjustable height center button contacts the laminate substrate. The method further includes fluxing the laminate substrate, placing a chip onto the laminate substrate, and placing the fixture into a reflow furnace to join the chip and the laminate substrate.

20 Claims, 13 Drawing Sheets

(56) References Cited

U.S. PATENT DOCUMENTS

| | | | |
|---|---|---|---|
| 6,986,191 B2 | 1/2006 | White | |
| 7,214,548 B2 | 5/2007 | Fayaz et al. | |
| 7,621,762 B2 | 11/2009 | Liaw | |
| 7,695,287 B2 | 4/2010 | Smith et al. | |
| 7,841,078 B2 | 11/2010 | Lam et al. | |
| 7,977,206 B2 | 7/2011 | Yamazaki | |
| 2002/0174951 A1 | 11/2002 | Hu et al. | |
| 2004/0180474 A1* | 9/2004 | Oman | 438/125 |
| 2006/0163330 A1 | 7/2006 | Chapman et al. | |
| 2009/0165957 A1 | 7/2009 | Lee | |
| 2010/0038762 A1* | 2/2010 | Okugawa et al. | 257/678 |
| 2011/0049221 A1* | 3/2011 | Blais et al. | 228/179.1 |
| 2011/0089550 A1 | 4/2011 | Kogure et al. | |
| 2011/0233719 A1* | 9/2011 | Blanchard | 257/506 |
| 2013/0323345 A1 | 12/2013 | Blackshear et al. | |

FOREIGN PATENT DOCUMENTS

| | | |
|---|---|---|
| JP | 02-116550 | 1/1990 |
| JP | 02-116551 | 5/1990 |
| JP | 03-016731 | 1/1991 |
| JP | 03-239528 | 10/1991 |
| JP | 06-326443 | 11/1994 |
| JP | 11-177228 | 7/1999 |
| JP | 2000-169265 | 6/2000 |
| JP | 2004-022706 | 1/2004 |
| JP | 2004-22706 | 1/2004 |
| JP | 4031368 | 10/2007 |
| JP | 2010-272778 | 2/2010 |
| JP | 2011-66027 | 3/2011 |
| JP | 2011-066027 | 3/2011 |
| KR | 10-2011-0024341 A | 3/2011 |
| WO | 2004099793 A2 | 11/2004 |
| WO | 2013184324 A1 | 12/2013 |

OTHER PUBLICATIONS

International Search Report/Written Opinion for PCT/US2013/041486, mailed on Aug. 26, 2013.

* cited by examiner

METHOD FOR SHAPING A LAMINATE SUBSTRATE

BACKGROUND OF THE INVENTION

The present invention relates generally to a method for shaping a laminate substrate and more particularly to a method for shaping a laminate substrate at chip join temperatures.

High production flip chip organic composite laminate substrates are multi layer structures consisting of alternating layers of conductive metallurgy and dielectric. Dielectric layers may be particle filled organic dielectric (build-up layers) or particle and glass fiber filled organic dialectic (core). Laminate substrates may have length and width in the range of 20 mm to 75 mm, while thickness varies in the range of 0.3 mm to 3 mm. Individual build-up layer thicknesses are in the range of 15 um for copper, 33 um for build-up dielectric and 100 um to 1 mm for core. Laminate substrates have typical build-up dielectric coefficient of thermal expansion (CTE) values of 46 ppm/degree C., and core CTE values of 15 ppm/degree C. Next-generation materials have typical build-up dielectric CTE values of 20 ppm/degree C. and core CTE values of 12 ppm/degree C. Copper material used in composite laminate substrate fabrication is considered to have a CTE value of approximately 17 ppm over the temperature range of interest. Composite CTEs of laminate substrates are in the range of 15 ppm to 20 ppm. Room temperature dielectric loss tangent values of next generation laminate substrate materials are approx. 0.007, which are superior to current production laminates, which have loss tangent values of approximately 0.017.

Due to differential expansion and cure shrinkage of various composite laminate substrate materials during fabrication and use, laminate substrates are non-flat at most temperatures, but may approach a coplanar condition at a single temperature. In particular, laminate substrate silicon chip placement sites, due to high functional wiring density in that location, display strong thermal warpage tendencies over temperature. For best chip assembly yields, it is necessary to control the shape of the chip site during the assembly process. As the temperature of the laminate substrate varies widely during flip chip solder reflow assembly, the shape of the chip site also changes widely. It is necessary to control the shape of the chip site in a non-flat condition to produce a desired range of shapes at solder reflow chip join temperatures for best assembly yields.

SUMMARY OF THE INVENTION

In a first aspect of the invention, a method includes providing a laminate substrate. The method includes characterizing the laminate substrate for warpage characteristics. The method includes determining if a correction is needed based on the warpage characteristics. The method includes placing the laminate substrate into a fixture with a necessary correction. The method includes fluxing the laminate substrate. The method further includes placing a chip onto the laminate substrate. The method also includes placing the fixture into a reflow furnace to join the chip and the laminate substrate.

In a further aspect of the invention, a method includes providing a fixture comprising a trap ring, a base plate having a recess adapted to receive a laminate substrate, the base plate including an opening and an adjustable height center button disposed in the opening. The method includes characterizing the laminate substrate for warpage characteristics by using one of room temperature techniques and elevated temperature techniques. The method includes determining if a correction is needed based on the warpage characteristics. The method includes placing a laminate substrate into the fixture with a necessary correction. The method includes fluxing the laminate substrate. The method further includes placing a chip onto the laminate substrate. The method also includes placing the fixture into a reflow furnace to join the chip and the laminate substrate.

In a further aspect of the invention, a fixture includes a trap ring. The fixture further includes a base plate having a recess adapted to receive a laminate substrate, the base plate including an opening. The fixture also includes a center button disposed in the opening.

In a further aspect of the invention, a fixture includes a trap ring. The fixture includes a base plate having a recess adapted to receive a laminate substrate, the base plate including an opening. The fixture further includes a plurality of cavities formed in the recess. The fixture also includes an adjustable height center button disposed in the opening.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

This invention provides a fixture and method for shaping a laminate substrate, such as a flip-chip plastic ball grid array (FCPBGA) laminate substrate, at chip join temperatures. It has been determined that at chip join temperatures, current generation high-volume production laminate substrates are slightly convex in shape. Also, it has been determined that next-generation high-performance laminate substrates are slightly concave in shape. Also, it has been determined that at room temperature, current generation laminate substrates revert to a concave shape, while next generation laminate substrates remain so. This invention achieves a preferred chip site warpage shape in order to maximize chip joining performance and minimize yield loss. The shape of the laminate substrate is controlled to produce an optimum shape over the range of chip join temperatures. The invention shapes the laminate substrate in the chip site region, at the chip join temperatures, to obtain good chip joining yields. It has been determined that for best yields, laminate substrates should be slightly convex, such as from 0 um to 10 um over the chip site area, over the range of chip join solder liquidus temperature.

Figure 1:
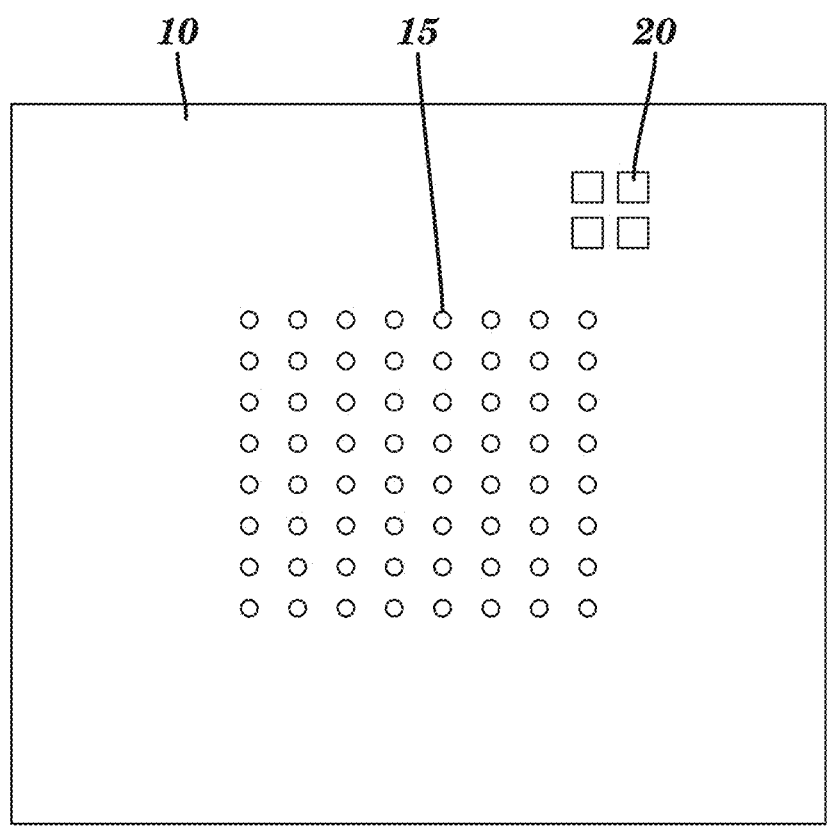
FIG. 1 shows a top view of a presolder bumped laminate substrate.

FIG. 1 shows a top view of a presolder bumped laminate substrate 10 having a presolder bumped chip site 15 and capacitor presolder bumps 20. Laminate substrate 10 is approximately 55 mm square, but could be larger or smaller. Presolder bumped chip site 15 is approximately 20 mm square, but could be larger or smaller. Presolder bump height may be approximately 20 um, but could be taller or shorter. Capacitor presolder bump height may be approximately 50 um, but could be taller or shorter.

Figure 2:
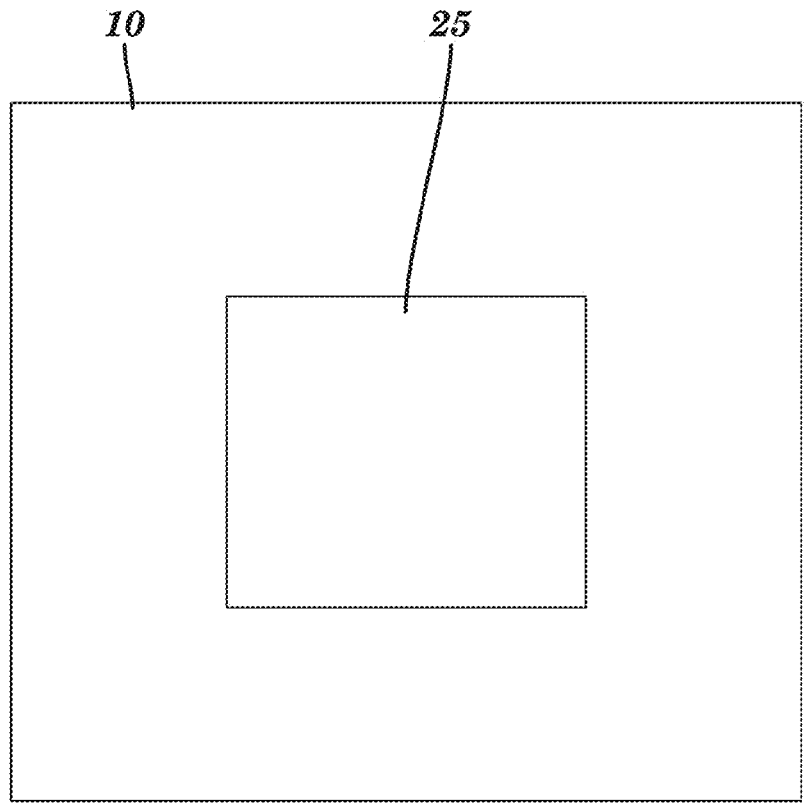
FIG. 2 shows a top view of a chip joined to the laminate substrate.

FIG. 2 shows a top view of a chip 25 joined to laminate substrate 10 at the presolder bumped chip site. Chip 25 is approximately 20 mm square, but could be larger or smaller. Chip 25 may be joined to laminate substrate 10 using conventional methods.

Figure 3:
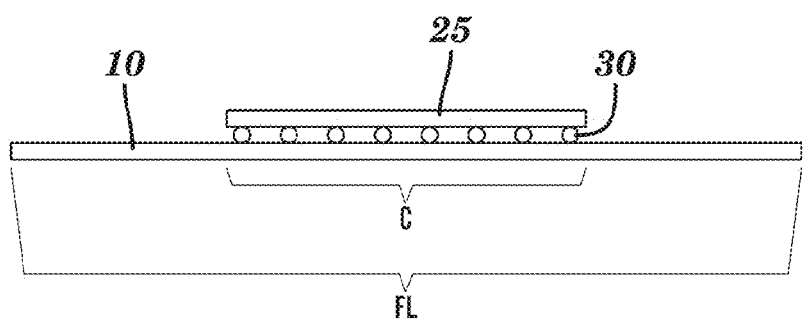
FIG. 3 is a side view of FIG. 2.

FIG. 3 shows a side view of FIG. 2. Laminate substrate 10 is approximately 1 mm thick, but could be thinner or thicker. Chip 25 is joined to laminate 10 with C4 solder balls 30. Reference letter C denotes a chip site warpage measurement area. Typical chip site warpages are up to 50 um and may be convex or concave at room temperature, but are generally concave at the chip interface. Reference letter FL denotes a full laminate warpage measurement area. Typical full laminate warpages are approximately 50 um to 200 um and may be convex or concave at room temperature.

Referring to FIGS. 4-8, a fixture 86 according to an embodiment of the invention includes a base plate 40, a trap ring 60 and a center button 70. The fixture 86 may be used for controlling the shape of the laminate substrate 10 to produce an optimum shape over the range of chip join temperatures. The base plate 40 may be a flat plate larger in two horizontal dimensions than the laminate substrate 10. In the vertical direction, the base plate 40 has sufficient thickness to be substantially free from out of horizontal plane distortion down to micron levels resulting from thermal expansion over the temperature range of interest, from room temperature to solder joining temperature. The base plate 40 may be formed with a recess 42 on one side, which approximately positions the laminate substrate 10 within the fixture. The recess 42 is larger than the laminate substrate 10 in the horizontal plane. The recess 42 is sized such that it does not constrain the thermal expansion of the laminate substrate 10 over the temperature range of interest, considering both the thermal expansion of the base plate 40 and that of the laminate substrate 10. The depth of the recess 42 may vary from only that required for positioning of the laminate substrate 10, approximately 0.1 mm, to equal or greater than the thickness of the laminate substrate. The base plate 40 may be formed with a through opening 45 in the center positioned such that it is centered on the laminate substrate 10 largely within the chip site area. The opening 45 may contain features enabling mating with a center button 70 such that the height of the center button 70 is adjustable with a high degree of precision, in the range of 10 um.

Figure 12:
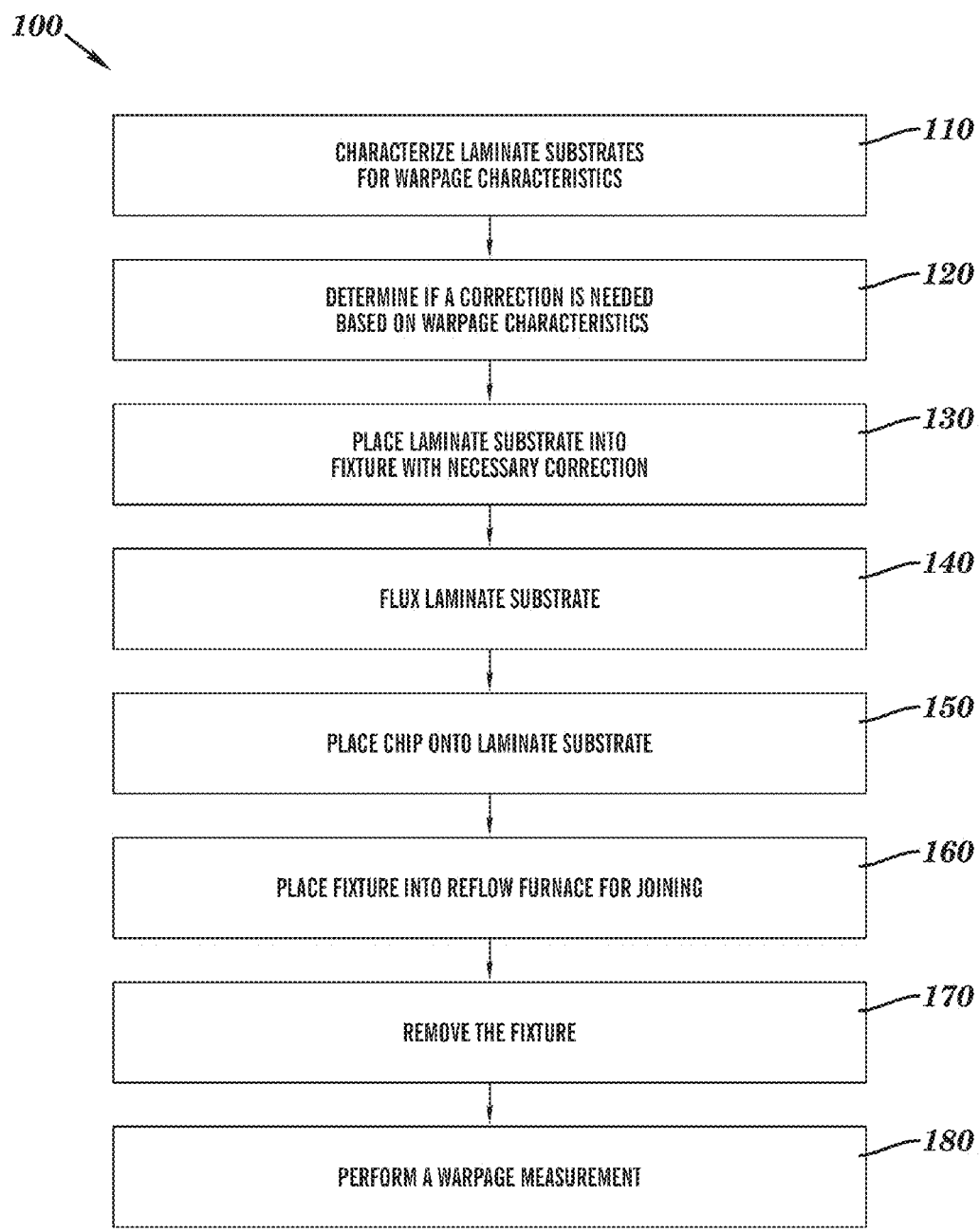
FIG. 12 is a flow chart for process steps according to an embodiment of the invention.

Referring to FIGS. 7A-7D, these features may be a stepped structure with a flat top 70 or a ring top 72, enabling the use of controlled thickness shims 97 as shown in FIG. 12 for height adjustment, or a threaded structure with a flat top 80 or a ring top 82, such that height may be adjusted by rotation of the center button, or by other similar means. Alternatively, the center button 70 may be an integral part of the base plate 40 of a fixed height. The recess 42 in the base plate 40 has an area coplanar to the limit of fabrication capability at its peripheral surface. The recess 42 may be fully coplanar for the majority of its perimeter over a narrow band enabling the capture of the laminate substrate edge over the entire temperature range of interest considering differential expansion. This coplanar band width may be in the range of about 0.5 mm to about 5 mm, or larger.

Figure 5A:
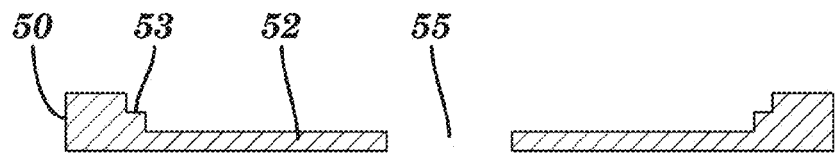
FIG. 5A is a top view of a base plate according to another embodiment of the invention.
Figure 5B:
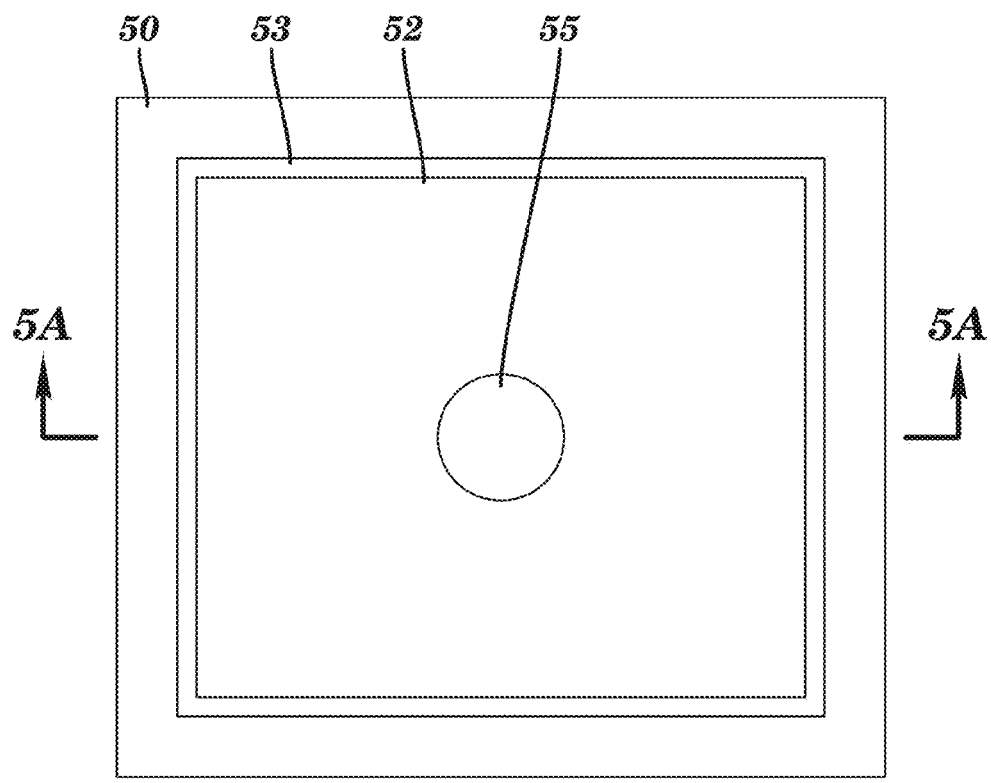
FIG. 5B is a side view of FIG. 5A.
Figure 7A:
FIGS. 7A-7F are side and top views respectively of a center button according to various embodiments of the invention.
Figure 7B:
Figure 7E:
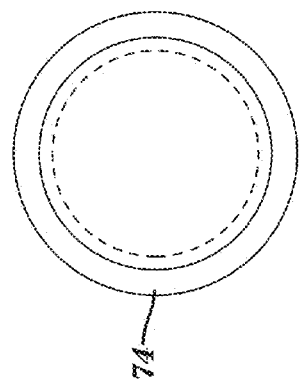
Figure 7C:
Figure 7D:
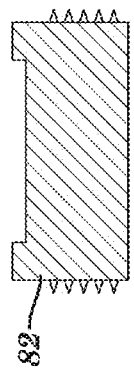

Referring to FIGS. 5A-5B, according to another embodiment of the invention, an alternative base plate 50 may include cavities 53, outside of the coplanar band, formed in a base plate recess 52 to provide clearance for protrusions such as presolder deposits on the laminate substrate surface, such that the laminate substrate surface is entirely supported by the base plate 50 rather than any protrusions. Base plate 50 may be formed with a through opening 55 in the center positioned such that it is centered on the laminate substrate largely within the chip site area. The opening 55 may contain features enabling mating with a screw adjustable center button 70 such that the height of the center button 70 is adjustable with a high degree of precision, in the range of 10 um. Referring to FIGS. 7C-7D, these features may be a threaded structure with a flat top 80 or a ring top 82, such that height may be adjusted by rotation of the center button, or by other similar means.

Figure 4A:
FIG. 4A is a top view of a base plate according to an embodiment of the invention.
Figure 4B:
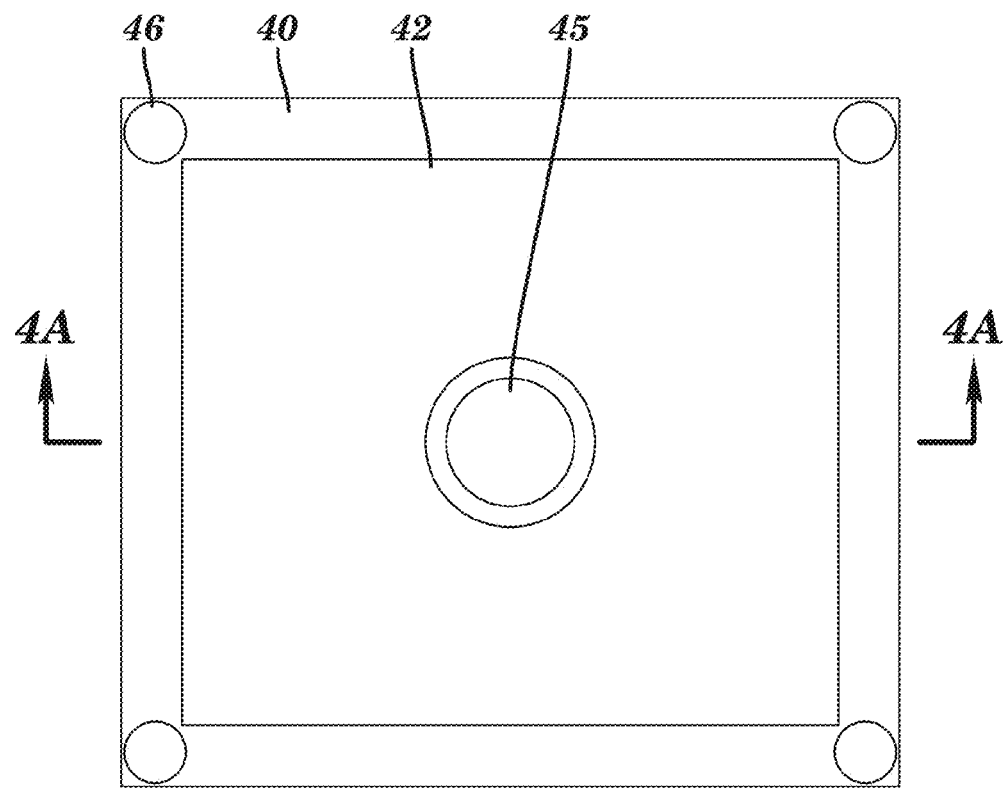
FIG. 4B is a side view of FIG. 4A.
Figure 6:
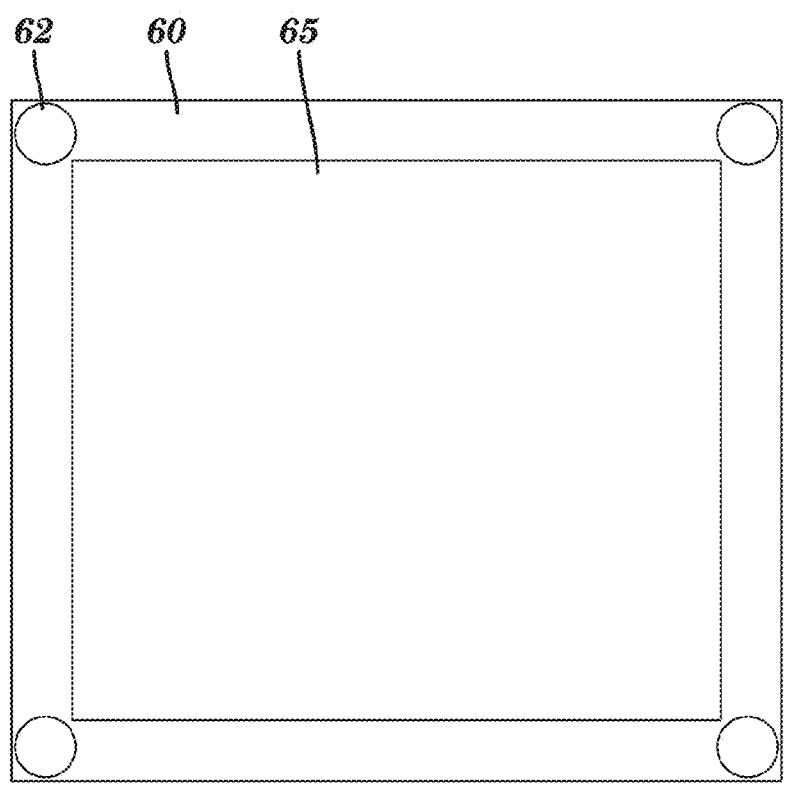
FIG. 6 is a top view of a trap ring according to an embodiment of the invention.

Referring to FIG. 6, the trap ring 60 may be a frame sized to mate with the base plate 40, capturing the laminate 10 at the substrate periphery. The trap ring 60 may include an opening 65. The trap ring 60 width may be narrow such that it constrains the warpage shape of the laminate substrate 10 only at its periphery in the area of the base plate coplanar band. The laminate substrate 10 is fully constrained flat at its periphery over the entire temperature range of interest. The width of the trap ring 60 capturing the substrate periphery may be in the range of 0.5 mm to 5 mm, more or less. Trap ring 60 may contain openings 62 for inserting locating features 90 (as shown in FIG. 8) into alignment holes 46 of the base plate 40 (as shown in FIG. 4B).

The trap ring 60 may be aligned with the base plate 40 by locating features 90 such as dowel pins, a base plate recess depth greater than the laminate substrate and trap ring protrusion into that recess or by other positioning features. The trap ring 60 is coplanar and substantially free of distortion over the temperature range of interest. The trap ring 60 and base plate 40 are fabricated such that movement and distortion of the laminate substrate 10 in the height direction in the coplanar band area are entirely constrained over the temperature range of interest. Outside of the coplanar band area the laminate substrate 10 is free to distort in the height dimension away from the base plate 40, while constrained by the base plate against movement downward. The force exerted by the trap ring 60 against the laminate 10 and base plate coplanar band is limited to the range of none to a few kilograms to enable lateral movement of the laminate in the horizontal direction during thermal expansion.

Figure 7F:
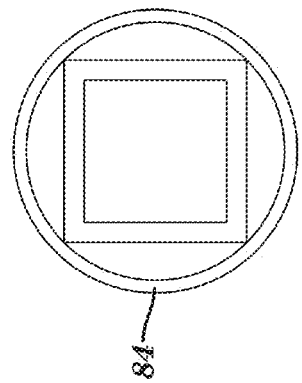

The center button 70 presents a substantially coplanar surface to the bottom of the laminate substrate 10 over a limited area in its center. Referring to FIGS. 7E-7F, this area may be round 74 or rectangular 84 in shape and may be less than, equal to, or greater than the laminate substrate chip site area as needed. The center button coplanar surface may be a narrow ring entirely outside the chip site area such that minimal substrate surface is contacted by the ring, permitting substrate protrusions such as solder deposits both inside and outside the chip site area without affecting the vertical height control of the substrate surface by the center button. Alternatively, the center button may be substantially flat over its entire top surface, and may contact either the laminate substrate surface or protrusions such as solder deposits as needed for vertical height control. The center button contains features for location and vertical height adjustment within the base plate such as screw threads 80, 82 or a stepped shape 70, 72 permitting the use of shims 97. When assembled in the base plate 40, the height of the center button coplanar surface may be adjustable independently of the base plate in the range of 0 to 200 um as needed to produce the desired laminate shape result.

Figure 8:
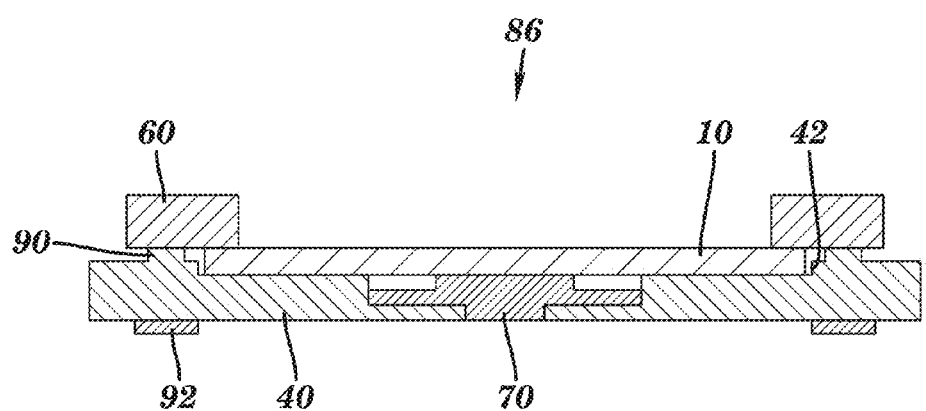
FIG. 8 is a side view of a fixture according to an embodiment of the invention.

Referring to FIG. 8, in use, the center button 70 may be assembled to the base plate 40 with vertical height adjusted to an ideal level determined by experiment or modeling. The laminate substrate 10 is oriented and placed within the recess 42 of the base plate 40, positioned approximately by that recess. The trap ring 60 may be assembled over the laminate substrate 10, positioned by its locating features 90. A controlled load may be imposed on the trap ring 60 by some means, such as a clamping feature, a force controlled spring or a weight under the influence of gravity, forcing the laminate substrate periphery into a coplanar condition against the base plate recess coplanar band. This load must be limited to the magnitude required to attain a laminate substrate coplanar condition while permitting the laminate substrate to move readily in the horizontal direction due to differential thermal expansion, eliminating height distortion of the laminate substrate during fixture use due to constraints on horizontal movement. For typical applications using laminate substrates with layer counts in the 6 to 14 metal layer range, the load applied to the laminate may be in the range from a low of zero to several kilograms or more. Base plate 40 may include a plurality of feet 92.

Fixture 86 provides constraint to a coplanar shape in one height direction. Fixture 86 provides freedom to move out of plane in a controlled manner in the other height dimension. Fixture 86 provides freedom to expand in the horizontal direction thermally without constraint such that out of plane distortion is not caused by constrained horizontal thermal expansion.

Figure 9:
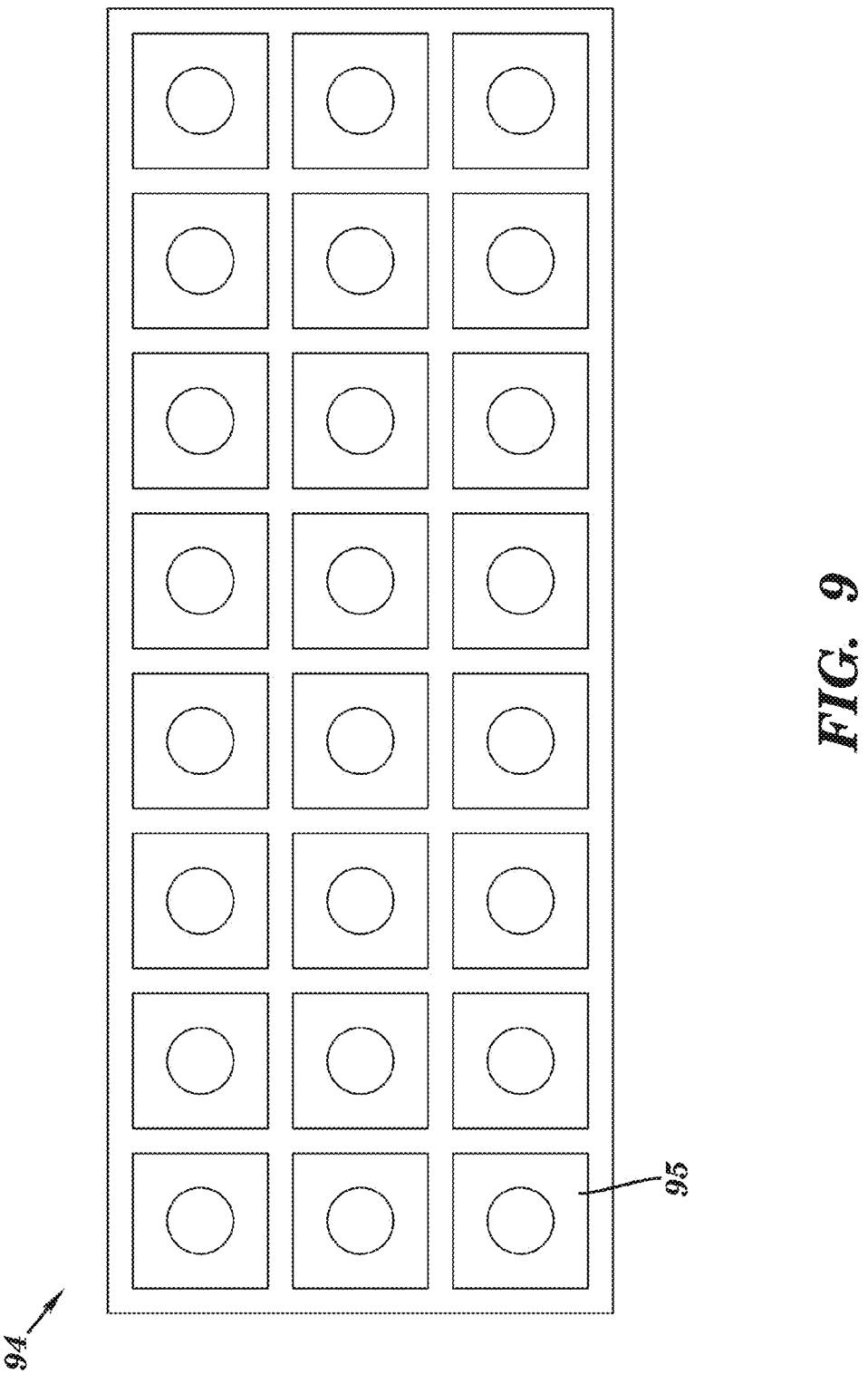
FIG. 9 is a top view of an array or panel size fixture implementation.
Figure 10:
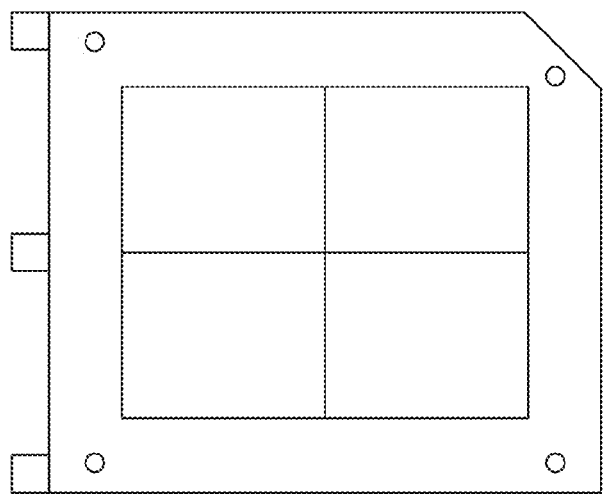
FIG. 10 is a top view of a 4-up fixture configuration.

In mass production, a fixture may be used singly as previously described or in an array 94 or panel size format as shown in FIG. 9 where the array may be in the size of 10 or more fixture pockets 95. FIG. 10 shows a top view of a 4-up fixture configuration 99 according to an embodiment of the invention.

Figure 11:
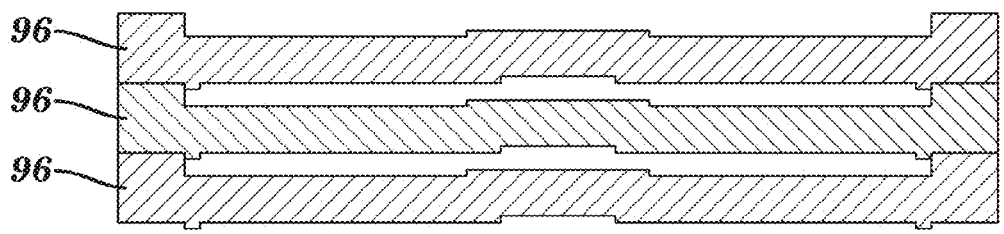
FIG. 11 is a side view of a fixture implementation in stackable trays.

The fixture center button may remain adjustable or may be fixed to an appropriate height as previously determined. The trap ring may remain single, or be in an array format of the size of the fixture pocket. A bottom of a base plate may be formed to perform the function of the trap ring such that fixtures are stackable trays 96 as shown in FIG. 11. The required load may be imposed by the fixture stack. Stackable fixtures may meet the requirements of JEDEC Publication 95 Design Guide 4.10, "Generic Shipping and Handling Matrix Tray", and be otherwise used for shipping and handling of laminate substrates. Fixture material may be metal, polymer, or composite, with the primary requirements that the material and structure be free of thermal distortion over the temperature range of interest, and not contaminate or otherwise degrade the laminate substrate during use. Laminate substrates may be fabricated in an array format in panel form, where panels may be as large as 0.5 meters X 0.7 meters. During processing, these panels may be reduced to sub panels of a fraction of original panel size. The laminate shaping fixture may be developed for application at the panel or sub panel level, where the pocket applies to the full area, and trap ring and center button apply to individual laminates and chip sites within the panel.

FIG. 12 shows a flow chart 100 for process steps according to an embodiment of the invention. In Step 110 laminate substrates are characterized for warpage characteristics prior to bond and assembly. As stated previously, current production laminate substrates are slightly convex at joining temperatures. Next generation laminate substrates are slightly concave at joining temperatures. The laminate substrates may be characterized using room temperature techniques, such as non-contact optical inspection systems, using tools made by KLA/ICOS, Nikon, RVSI or others that measure laminate coplanarity and warpage. Elevated temperature techniques including, but not limited to shadow moiré and digital image correlation (DIC) may also be used to characterize the laminate substrates. Since the elevated temperature techniques would damage the laminate substrates, they may be performed on sampling basis. Room temperature techniques may be performed on all of the laminate substrates to characterize them. Elevated temperature techniques may be performed on a sample or lot of laminate substrates as a guide, with the assumption that the other, non-tested laminate substrates in that lot behaved accordingly.

Optionally, after incoming measurement, the laminate substrates may be pre-baked to drive out moisture prior to use. The pre-bake may be performed at approximately 130 degree C. for approximately 8 hours. The laminate substrates may be vacuum sealed. The laminate substrates may be stored in nitrogen (N2) prior to use.

Figure 13:
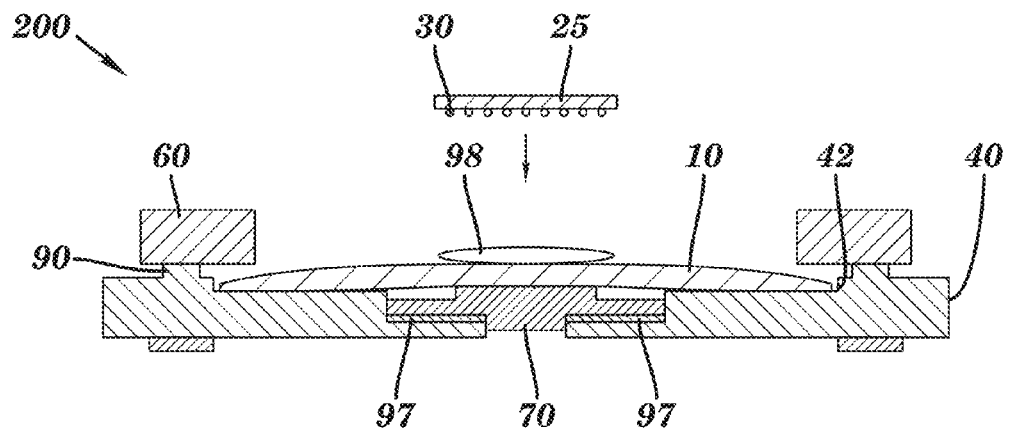
FIG. 13 is a side view of chip joining to a laminate substrate in a fixture according to an embodiment of the invention.

In step 120, based on the incoming laminate warpage characteristics measurement in step 110, any needed correction is determined, such as the number of shims 97 required in fixture 200 as shown in FIG. 13 (or height of a threaded button). The shims may be used in a given fixture corresponding to a given laminate or group of laminates. The fixture configuration may be 1-up, 4-up, 10-up and the like.

Figure 15:
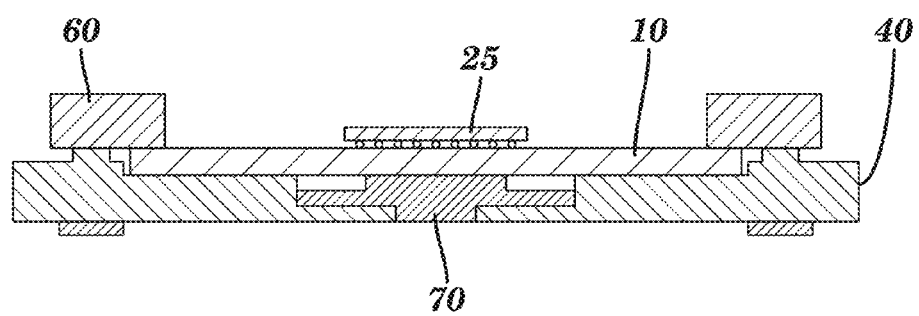
FIG. 15 is a side view of a fixture with no shims according to an embodiment of the invention.

If a given laminate substrate is highly concave, a thicker shim would be used in the fixture to make the laminate substrate more convex during chip joining. If another laminate substrate was slightly concave, a thinner shim, or possibly no shim (as shown in FIG. 15) may be used in the fixture. Shim heights, diameters and the like may be optimized based on laminate substrate material, XY size, chip site XY dimensions and the like. Trial and error techniques may be used or modeling work may be performed. Shim diameter may be approximately equal to a length of the chip diagonal. For a 20 mm square chip, a shim diameter of 28 mm may be used. For a laminate substrate having a 40 um concave chip site warpage at room temperature (and an approximately 20 um concave warpage at chip joining temperature), a shim having a thickness of 25 um may be used to make the laminate substrate chip site warpage slightly convex at chip join temperature.

In step 130 the laminate substrate 10 is placed into the fixture 200 with the proper number of shims 97 for the needed correction that was determined in step 110 (see FIG. 13). Shims 97 may have a thickness of 50 um, but may be thicker or thinner.

In step 140 flux 98 is applied to the laminate substrate 10 prior to chip placement (see FIG. 13). Flux 98 may be applied by spray application or other conventional methods. Alternatively, a chip may be dipped in flux prior to placement on the fluxed laminate substrate. A flux dipped chip may also be placed on an unfluxed laminate substrate.

Figure 14:
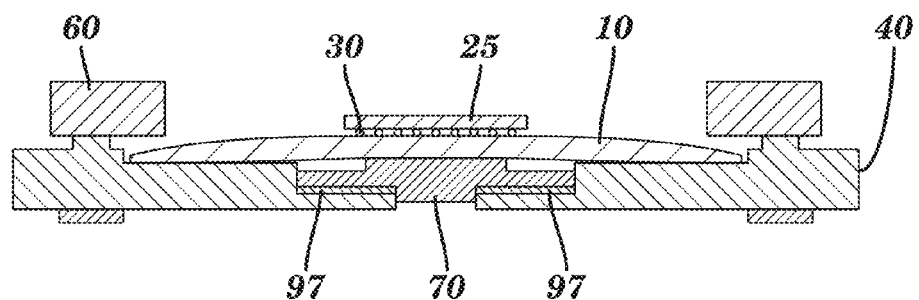
FIG. 14 is a side view of the chip joined to the laminate substrate in a fixture according to an embodiment of the invention.

In step 150 bumped chip 25 is placed onto the laminate substrate 10 (see FIG. 14). Automatic tooling aligns the chip 25 and the laminate substrate 10 features and places the chip C4 bumps 30 on top of the laminate chip site pattern. Chip placement tooling made by Datacon or other conventional tools may be used.

In step 160 the fixture, including the chip and laminate substrate, is placed into a reflow furnace (not shown) to melt the C4 solder, in the presence of flux, thus joining the chip to the laminate substrate. The chip and the laminate substrate may be joined in a N2 furnace atmosphere at a peak temperature of approximately 235 degree C. to 255 degree C. Typical times above 217 degree C. are approximately 30 seconds to 2 minutes, 30 seconds. Typical ramp up rates and cooling rates are 2 degree C./sec, but can vary.

In step 170, after the chip is joined to the laminate substrate, it is removed from the fixture and sent through a flux cleaning tool. Typical fluxes are water soluble. Flux cleaning is typically a water clean using high pressure water spray nozzles plus drying.

In step 180, the joined chip and laminate substrate warpage may be measured by non-contact optical inspection systems, using tools made by KLA/ICOS, Nikon, RVSI or others that measure coplanarity and warpage or by a non-contact white light reflectometry system such as an FRT tool, or similar means. A sample of joined chip and laminate substrates may also be measured using elevated temperature techniques such as shadow moiré and digital image correlation (DIC). Typical full laminate warpages may be approximately 200 um to 300 um post-chip join. Typical chip site warpages may be approximately 50 um to 100 um post-chip join. Also, a non-destructive X-ray inspection may be performed on the joined chip and laminate substrate to determine the amount of shorts or bridges. Shorting may be used as an indicator of the effectiveness of the fixture according to an embodiment of the invention. If the fixture was optimized by using the proper number of shims (or height of the threaded button) based on incoming laminate warpage data as described previously, then no shorts should be observed after chip join in X-ray inspection. If fixture conditions were not optimized, then shorting may be observed. If the shim (or threaded button) height was too low, causing the laminates to remain concave at chip joining, shorting or bridging of C4's at the chip site periphery may be noticed. If the shim (or threaded button) height was too high, causing the laminate to become too convex at chip join temperatures, excessive shorting may be noted on the center of the chip site area. Opens or nonwets may be observed at the chip site periphery.

Figure 16:
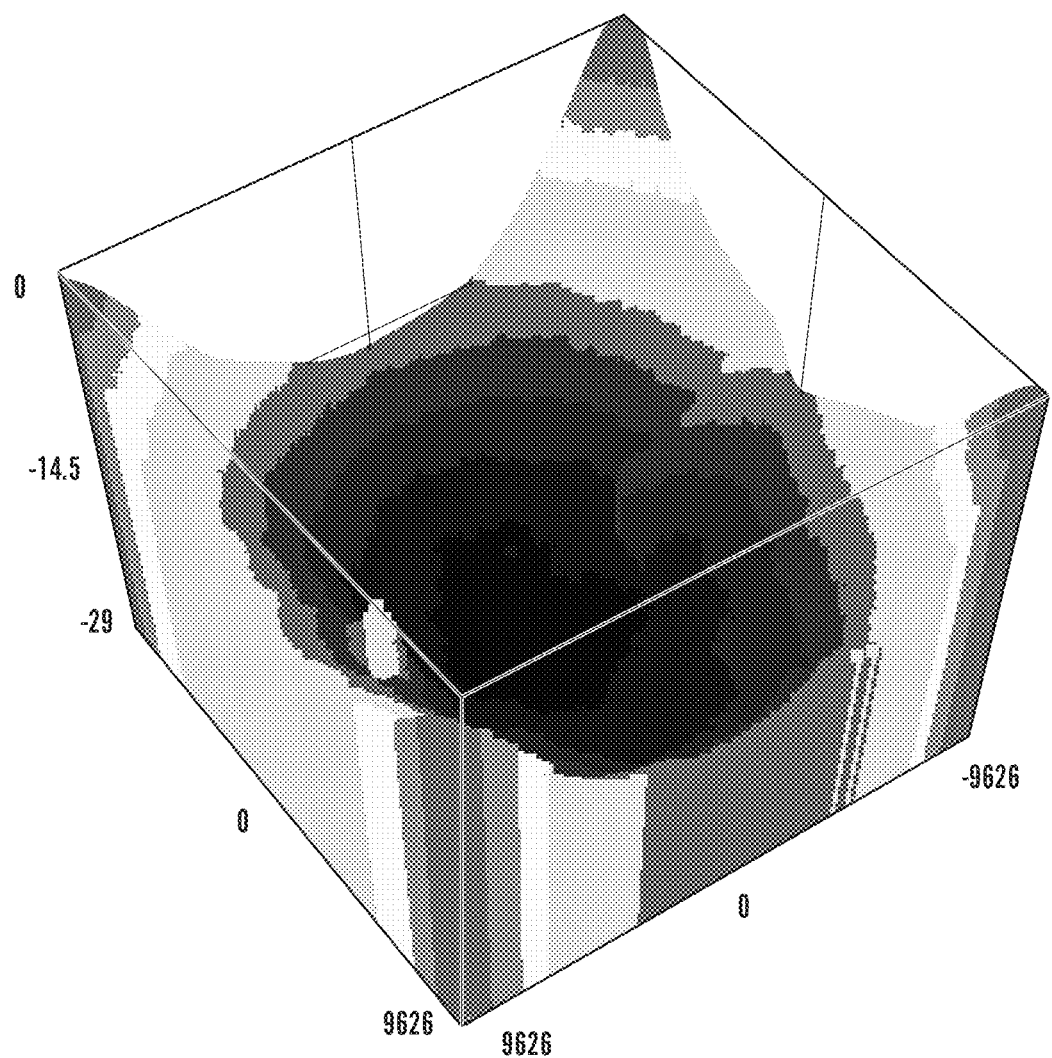
FIG. 16 is 3-D warpage plot of a chip site region for an incoming laminate substrate.

FIG. 16 shows a 3-D warpage plot of the chip site region for an incoming laminate substrate. The laminate substrate has a concave shape. The chip site warpage is approximately 28 um. The overall laminate warpage is approximately 100 um.

Figure 17:
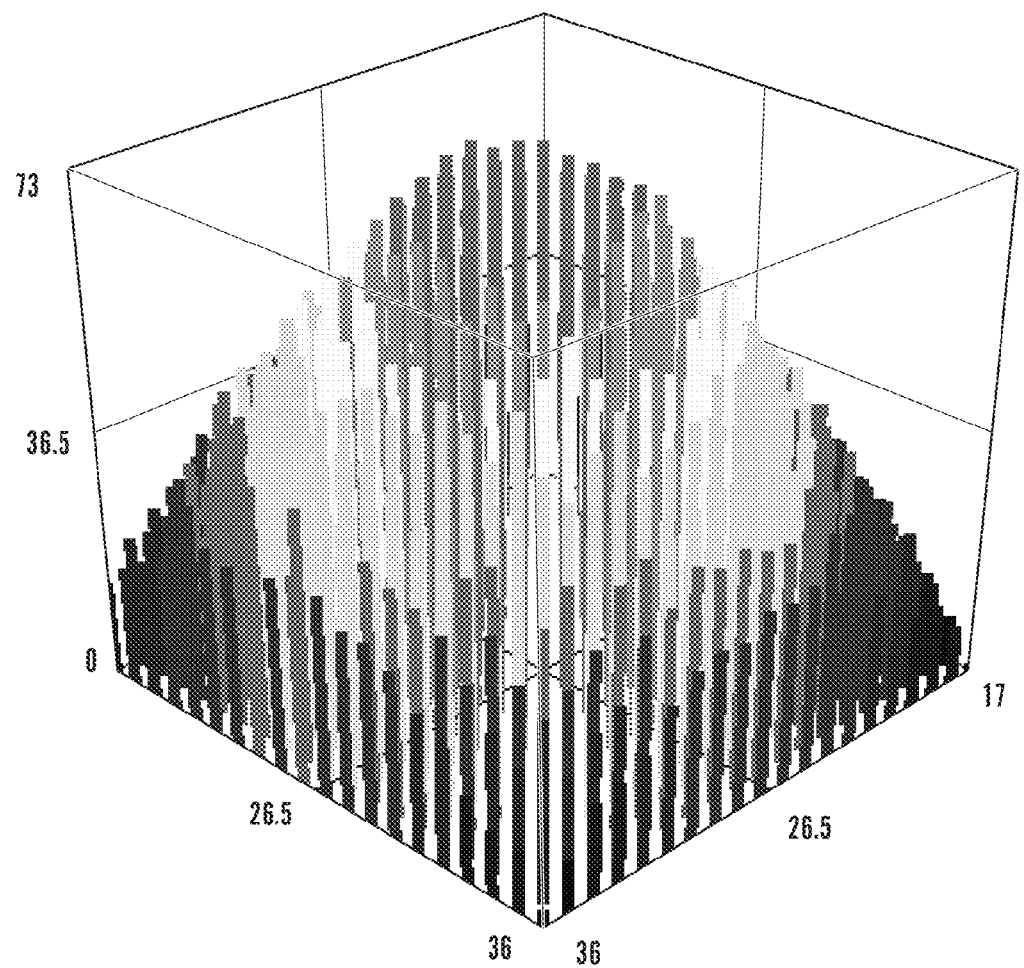
FIG. 17 is a 3-D warpage plot of the chip site region post-chip join in accordance with an embodiment of the invention.

FIG. 17 shows a 3-D warpage plot of the chip site region of same laminate substrate after chip join in accordance with an embodiment of the invention. The laminate substrate now has a convex shape. The chip site warpage is approximately 74 um. The overall laminate warpage is approximately 200 um.

After chip join yields have been assured and optimized, subsequent conventional bond and assembly process steps may be performed on the joined chip and laminate substrates. Thus, the incoming laminate substrate measurement, chip join, reflow and re-measurement may be used as an iterative process to determine the optimized fixture conditions for a given laminate substrate form factor. Once determined and optimized, those conditions may be used to run laminate substrates of a given form factor with varying incoming warpages, to achieve joined modules with high chip join yields for the next-generation FCPBGA packages.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method, comprising:
   providing a fixture comprising a trap ring, a base plate having a recess adapted to receive a laminate substrate, the base plate including an opening and an adjustable height center button disposed in the opening, the opening being located within the recess and located in a center of the laminate substrate;
   characterizing the laminate substrate for warpage characteristics by using one of room temperature techniques and elevated temperature techniques;
   determining a horizontal plane distortion based on the warpage characteristics;
   placing the laminate substrate into the fixture with an adjustment to correct the horizontal plane distortion, the adjustment is provided by the adjustable height center button, wherein the adjustable height center button contacts the laminate substrate;
   fluxing the laminate substrate;
   placing a chip onto the laminate substrate; and
   placing the fixture into a reflow furnace to join the chip and the laminate substrate.

2. The method according to claim 1, wherein the adjustment includes placing a shim between the fixture and the adjustable height center button.

3. The method according to claim 1, wherein the adjustable height center button comprises a threaded button.

4. The method according to claim 1, further comprising:
   removing the fixture from the reflow furnace and performing a warpage measurement on the joined chip and laminate substrate.

5. The method according to claim 4, wherein the warpage measurement is performed using one of room temperature techniques and elevated temperature techniques.

6. The method according to claim 1, further comprising:
   modifying the adjustment based on shorts observed at a chip site.

7. The method according to claim 2, wherein a thicker shim is placed between the fixture and the adjustable height center button if the laminate substrate remains concave at chip joining.

8. The method according to claim 3, wherein a thinner shim is placed between the fixture and the adjustable height center button if the laminate substrate remains too convex at chip joining.

9. The method according to claim 3, wherein a height of the threaded button is raised if the laminate substrate remains concave at chip joining.

10. The method according to claim 3, wherein a height of the threaded button is lowered if the laminate substrate remains too convex at chip joining.

11. The method according to claim 1, further comprising:
adjusting a height of the adjustable height center button based on the horizontal plane distortion determined by characterizing the laminate substrate for warpage characteristics.

12. The method according to claim 1, further comprising: increasing a height of the adjustable height center button if the laminate substrate remains concave at chip joining.

13. The method according to claim 1, further comprising: decreasing a height of the adjustable height center button if the laminate substrate remains convex at chip joining.

14. The method according to claim 1, wherein the adjustable height center button directly contacts a bottom of the laminate substrate.

15. The method according to claim 1, wherein the center of the laminate substrate is approximately equidistant from all sides of the laminate substrate.

16. The method according to claim 1, wherein the adjustable height center button presents a substantially coplanar surface to a bottom of the laminate substrate over a limited area in its center, the limited area is round or rectangular in shape and is less than a predefined chip site area.

17. The method according to claim 1, wherein the adjustable height center button presents a substantially coplanar surface to a bottom of the laminate substrate over a limited area in its center, the limited area is round or rectangular in shape and is equal to a predefined chip site area.

18. The method according to claim 1, wherein the adjustable height center button presents a substantially coplanar surface to a bottom of the laminate substrate over a limited area in its center, the limited area is round or rectangular in shape and is greater than a predefined chip site area.

19. The method according to claim 1, wherein the adjustable height center button presents a substantially coplanar surface to a bottom of the laminate substrate over a limited area in its center, the coplanar surface of the adjustable center button is a narrow ring entirely outside a chip site area such that minimal substrate surface is contacted by the ring, permitting substrate protrusions such as solder deposits both inside and outside the chip site area without affecting the vertical height control of the substrate surface by the center button.

20. The method according to claim 1, wherein the adjustable height center button comprises a stepped shaped, and the adjustment includes placing a shim between the step of the adjustable height center button and the base plate.

* * * * *